(12) United States Patent  
Aoki

(10) Patent No.: US 7,126,427 B2  
(45) Date of Patent: Oct. 24, 2006

(54) ELECTRONIC CIRCUIT

(75) Inventor: Yuuichi Aoki, Tokyo (JP)

(73) Assignee: NEC Corporation, Tokyo (JP)

( * ) Notice: Subject to any disclaimer, the term of this patent is extended or adjusted under 35 U.S.C. 154(b) by 42 days.

(21) Appl. No.: 10/512,843

(22) PCT Filed: Jun. 10, 2003

(86) PCT No.: PCT/JP03/12788

§ 371 (c)(1),  
(2), (4) Date: Oct. 29, 2004

(87) PCT Pub. No.: WO2004/034582

PCT Pub. Date: Apr. 22, 2004

(65) Prior Publication Data

US 2005/0212603 A1    Sep. 29, 2005

(30) Foreign Application Priority Data

Oct. 8, 2002   (JP) .............................. 2002-294395

(51) Int. Cl.  
    *H03F 3/04* (2006.01)
(52) U.S. Cl. ..................................... 330/311; 330/296
(58) Field of Classification Search ................ 330/311, 330/296  
See application file for complete search history.

(56) References Cited

U.S. PATENT DOCUMENTS 3,449,686 A * 6/1969 Bladen ........................ 330/277  
5,043,639 A * 8/1991 Gurley et al. ................ 315/386  
6,127,886 A * 10/2000 Khabbaz et al. ............... 330/51

FOREIGN PATENT DOCUMENTS

JP           6-224647 A      8/1994  
JP           6-101653 B2    12/1994

* cited by examiner

*Primary Examiner*—Patricia Nguyen  
(74) *Attorney, Agent, or Firm*—Dickstein Shapiro LLP

(57) ABSTRACT

An electronic circuit includes transistors having first to third terminals, the third terminal controlling the current between the first terminal and the third terminal. The electronic circuit includes: a cascode amplifier (10) including an input transistor (Q1) receiving an input signal (IN) through the third terminal, and an output transistor (QO) having the first terminal connected to the second terminal of the input transistor (QI), the third terminal connected to the ground potential via a capacitor (C1) and the second terminal outputting therethrough an output signal; and a control circuit (20) including a control transistor receiving a control signal through the third terminal, and a diode connected to the first and second terminals of the control transistor (QC) in series. The third terminal of the output transistor (QO) of the cascode amplifier (10) is connected to the ground potential through the control transistor (QC) and the diode (D). The electronic circuit has a reduced signal switching time.

19 Claims, 19 Drawing Sheets

ELECTRONIC CIRCUIT

TECHNICAL FIELD

The present invention relates to an electronic circuit, and more particularly, to an electronic circuit that switches the circuit performance and signal paths by controlling the bias of a base-grounded or gate-grounded transistor of a cascade amplifier.

BACKGROUND ART

In a high-frequency circuit used in a wireless communication circuit, an electronic circuit adapted for switching the signal paths and gain therein is required. FIG. 10 shows a block diagram of a high-frequency transmission/reception unit arranged in general mobile wireless equipment. There is used an electronic circuit for switching signal paths of a high-frequency signal in a transmission/reception antenna switch 102 and in a transmission/reception oscillator switch 112, and also an electronic circuit for varying the circuit property and gain is used in part of a low noise amplifier 103, an intermediate frequency amplifier 106, a driver amplifier 110, and a transmission amplifier 111. Hereinafter, as examples of conventional electronic circuits, two high-frequency switches and one gain-variable amplifier will be described.

FIG. 11 shows an exemplified configuration of the conventional electronic circuit constituting a high-frequency switch (refer to Jpn. Pat. Laid-Open Publication No. 2000-278109, FIG. 1). In this electronic circuit, a transistor QI and a transistor QO are cascode-connected, and the base of the transistor QI is supplied with a high-frequency input signal from an input terminal IN. The transistor QO has its base connected to a capacitor C1 for grounding the transistor with high frequency and a control signal terminal CTL. When the transistor QO is turned on or off by a signal from the control signal terminal CTL, a high-frequency signal output from a signal output terminal OUT is varied.

FIG. 13 shows an exemplified configuration of the conventional electronic circuit constituting a high-frequency switch (refer to Jpn. Pat. Laid-Open Publication No. 9-121119, FIG. 1). In this electronic circuit, a transistor QI has its collector cascode-connected to emitter-connected transistors QO1 and QO2, and the base of the transistor QI is supplied with a high-frequency input signal from an input terminal IN. The transistors QO1 and QO2 have their bases connected to capacitors C1 and C2 for grounding the transistors with high frequency and switches SW1 and SW2 for switching the on/off of the transistors QO1 and QO2, respectively. When the switches SW1 and SW2 are switched, signal output terminals OUT1 and OUT2 are switched.

FIG. 14 shows an exemplified configuration of the conventional electronic circuit constituting a gain-variable amplifier (refer to Jpn. Pat. Laid-Open Publication No. 2002-151983, FIG. 1). In this electronic circuit, a cascade amplifier including a transistor QI1 that has its source grounded and a transistor QO1 that has its base grounded through a capacitor C1, and a cascade amplifier including a transistor QI2 that has its source grounded and a transistor QO2 that has its base grounded through a capacitor C2 are arranged in parallel, and the transistor QI2 has its gate connected to the drain of the transistor QIO through a capacitor C3. The gate of the transistor QI1 is supplied with a high-frequency input signal from an input terminal IN. When the biases of the transistor QO1 and transistor QO2 are controlled by a control power source Vc connected through resistors R1 and R3, gains of the cascode amplifiers are controlled.

The techniques as described above are common in controlling the bias of the base of a base-grounded or gate-grounded transistor, which is grounded through a capacitor, of a cascode amplifier so as to switch the circuit performance and signal paths.

In the conventional electronic circuits in which the bias of the base of a base-grounded or gate-grounded transistor, which is grounded through a capacitor, of a cascode amplifier is controlled so as to switch the circuit performance and signal paths, there is a raised problem that the switching time is delayed because it takes time to charge or discharge grounded capacitors.

For example, in an electronic circuit shown in FIG. 12 which includes the conventional switch shown in FIG. 11 and a control circuit having a transistor QC, resistors R2 and R3, when turning on the transistor QO, the capacitor C1 is charged by a power source Vcc2 through a resistor R1. It is assumed here that the charging voltage of the capacitor C1 when the switch is off is V0, the voltage between the collector and emitter when the transistor QI is turned on is VCEQI, the voltage between the base and emitter when the transistor QO is turned on is VBEQO, and the base current until the transistor QO is turned on is sufficiently small. Time required for the switch to be turned on from off is equal to time required for the charging voltage VC1 of the capacitor C1 to be charged to VCEQI+VBEQO from V0.

The charging voltage VC1 at time "t" after the control circuit is switched is represented by the following expression 1:

$$VC1(t) = (V0 - Vcc2)\exp\{-t/(R1 \cdot C1)\} + Vcc2 \qquad (1)$$

That is, the switching time from off to on significantly depends on a time constant of the resistor R1 and capacitor C1.

FIG. 16 shows a graph indicative of the relation between the charging voltage VC1 and time "t" which is obtained when the R1 is 10 kO, C1 is 10 pF, Vcc2 is 3.0 V, V0 is 0.2 V, VCEQI is 0.6 V, and VBEQO is 1.2 V. It is to be noted that the switching time required to get to the state of VC1(t)>VCEQI+VBEQO is 77 ns. The switching time from off to on can be reduced by increasing the value of the resistor R2 to increase the charging voltage V0 at the time of off. On the other hand, since the switching time from on to off similarly depends on the time constant of the resistor R2 and capacitor C1, the switching time from on to off is undesirably increased.

It is an object of the present invention to provide an electronic circuit that can reduce the delay of the switching time due to the charging time of a grounded capacitor.

DISCLOSURE OF THE INVENTION

The present invention provides, in a first aspect thereof, an electronic circuit including: a cascode amplifier including an input transistor having first to third terminals, the third terminal of the input transistor controlling a current between the first terminal and the second terminal thereof and receiving an input signal therethrough, and an output transistor having first to third terminals, the third terminal of the output transistor controlling a current between the first terminal and the second terminal thereof, the first terminal of the output transistor being connected to the second terminal of the input transistor, the third terminal of the output transistor being connected to a reference potential through a capacitor, the second terminal of the output transistor outputting an output signal therethrough; and a control circuit including a control transistor having first to third terminals, the third terminal of the control transistor controlling a current between the first terminal and the second terminal thereof and receiving a control signal therethrough, and a diode connected to the first and second terminals of the control transistor in series, wherein the third terminal of the output transistor of the cascode amplifier is connected to the reference potential through the control transistor and the diode of the control circuit.

The present invention provides, in a second aspect thereof an electronic circuit including: a cascode amplifier including an output transistor having first to third terminals, the third terminal of the output transistor controlling a current between the first terminal and the second terminal and connected to a reference potential through a capacitor, the first terminal of the output transistor receiving an input signal therethrough, the second terminal of the output transistor outputting an output signal therethrough, and a current source transistor having first to third terminals, the third terminal of the current source transistor controlling a current between the first terminal and the second terminal thereof, the current source transistor determining an amount of the current between the first terminal and the second terminal of the output transistor during an on-state of the output transistor, the first terminal of the output transistor being connected to the second terminal of the current source transistor; and a control circuit including a control transistor having first to third terminals, the third terminal of the control transistor controlling a current between the first terminal and the second terminal thereof and receiving a control signal therethrough, and a diode connected to the first and second terminals of the control transistor in series, wherein: the third terminal of the output transistor of the cascode amplifier is connected to the reference potential through the control transistor and the diode of the control circuit.

According to the electronic circuit of the present invention, by using a control circuit having a diode that is connected to first and second terminals of a transistor in series, discharge amount of a grounded capacitor of a cascode amplifier can be reduced when the cascode amplifier is turned off. Consequently, recharging time can be reduced, and the switching time from off to on can be reduced without increasing the switching time from on to off.

Especially, in switching on/off of the cascode amplifier, when the sum of a voltage drop between the first terminal and second terminal of an input transistor and a voltage drop between the first terminal and third terminal of an output transistor, the sum turning off the cascode amplifier, is equal to a voltage drop by the control circuit, the switching circuit implemented by the electronic circuit of the present invention can be switched in significantly short switching time.

BEST MODE FOR CARRYING OUT THE INVENTION

The electronic circuit according to embodiments of the present invention will be described below with reference to the accompanying drawings.

Figure 1:
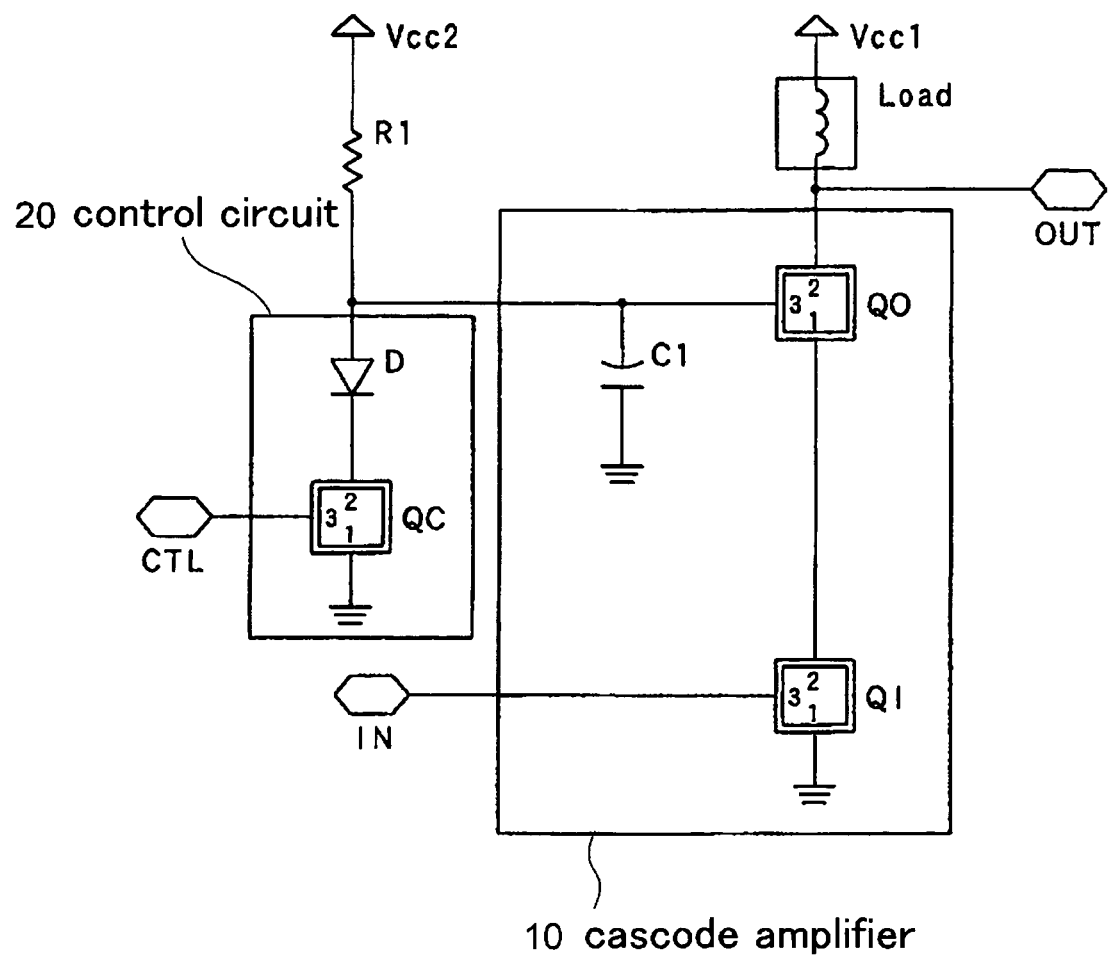
FIG. 1 is a circuit diagram of an electronic circuit according to a first embodiment of the present invention.

Referring to FIG. 1 showing an electronic circuit according to a first embodiment of the present invention, the electronic circuit includes a cascode amplifier 10 that has transistors whose third terminal is used for controlling a current between the first terminal and second terminal, and a control circuit. The cascode amplifier 10 has an input transistor QI whose third terminal receives an input signal from a high-frequency signal input terminal IN, and an output transistor QO whose first terminal is connected to the second terminal of the input transistor QI, and whose third terminal is connected to a reference potential through a capacitor C1, and whose second terminal outputs an output signal. The control circuit 20 has a control transistor QC whose third terminal receives a control signal from a control signal terminal CTL, and a diode D that is connected to the first and second terminals of the control transistor QC in series. In the present electronic circuit, the output transistor QO has its third terminal connected to the reference potential through the control circuit 20, and output amount of an input signal to an output terminal OUT can be controlled by controlling the bias of the third terminal of the output transistor QO.

A power source Vcc2 and a resistor R1 configure a bias circuit that biases the third terminal of the output transistor QO. The present invention is effective so long as the bias circuit that biases the third terminal of the output transistor QO is not an ideal voltage source whose internal impedance is zero. This is because a problem of the delay due to the charging time of a capacitor is raised even though other bias circuits such as a current mirror or a current source are used.

In the above-described electronic circuit, in case the transistor is a bipolar transistor, the first terminal is the emitter, the second terminal is the collector, and the third terminal is the base. In case the transistor is a field-effect transistor, the first terminal is the source, the second terminal is the drain, and the third terminal is the gate.

The performance of the first embodiment shown in FIG. 1 will be described for the case where all the transistors are bipolar transistors. In turning on the cascode amplifier 10, the capacitor C1 is charged by the power source Vcc2 through the resistor R1. It is assumed herein that the charging voltage of the capacitor C1 when the switch is off is V0, the voltage between the collector and emitter when the input transistor QI is turned on is VCEQI, the voltage between the collector and emitter when the input transistor QI is turned off is VCEQIOFF, the voltage between the base and emitter when the output transistor QO is turned on is VBEQO, and the base current until the output transistor QO is turned on is sufficiently small. Time required for the switch to be turned on from off is equal to time required for the charging voltage VC1 of the capacitor C1 to be charged to VCEQI+VBEQO from V0. So far, the performance is similar to the case of the conventional switch shown in FIG. 12.

Figure 2:
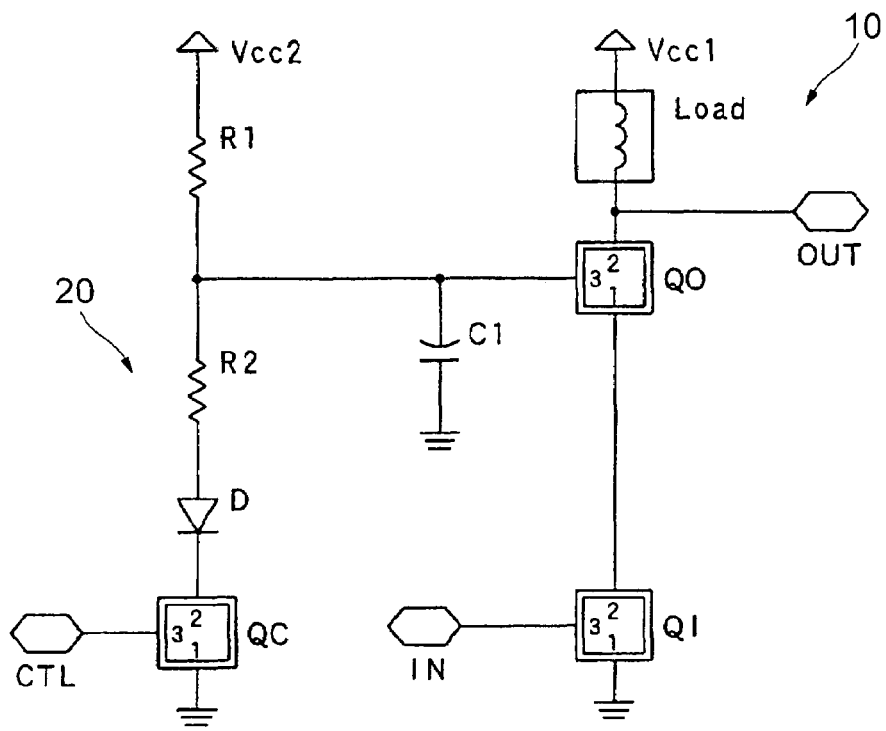
FIG. 2 is a circuit diagram of an exemplified modification of the electronic circuit shown in FIG. 1.
Figure 12:
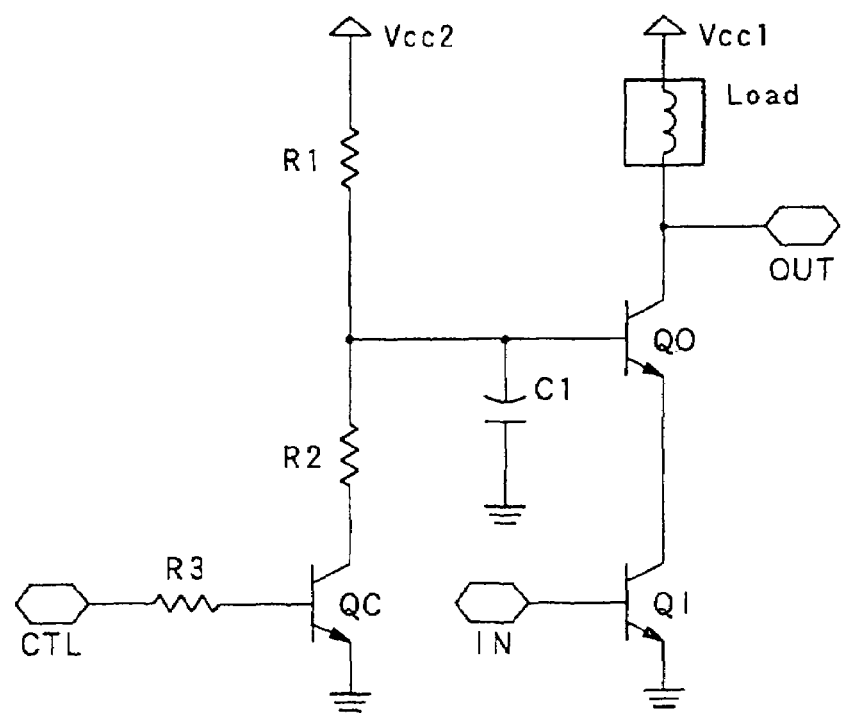
FIG. 12 is a circuit diagram of another conventional electronic circuit.
Figure 13:
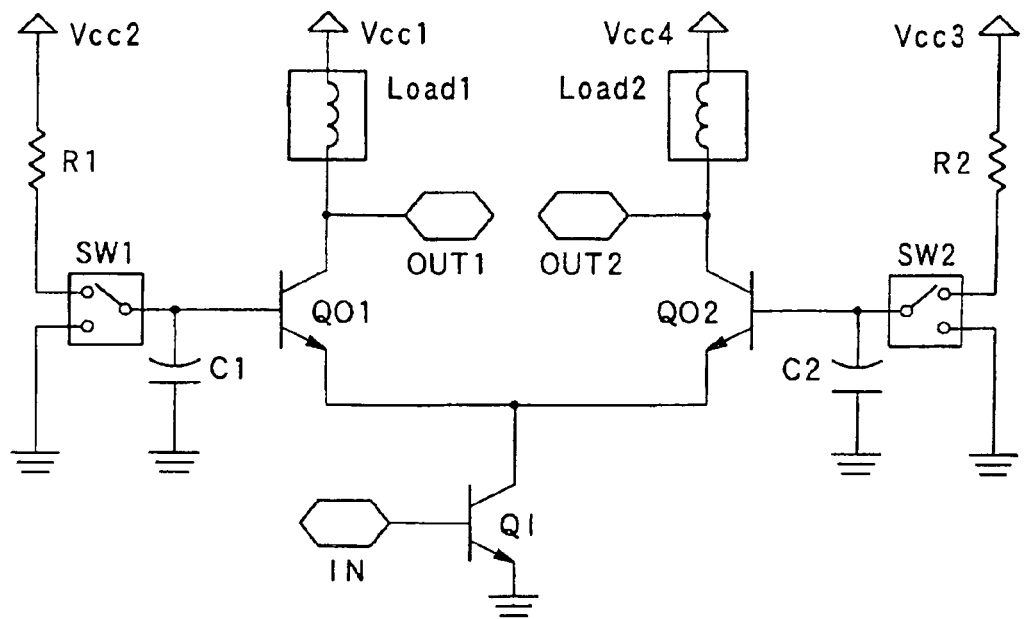
FIG. 13 is a circuit diagram of another conventional electronic circuit.
Figure 14:
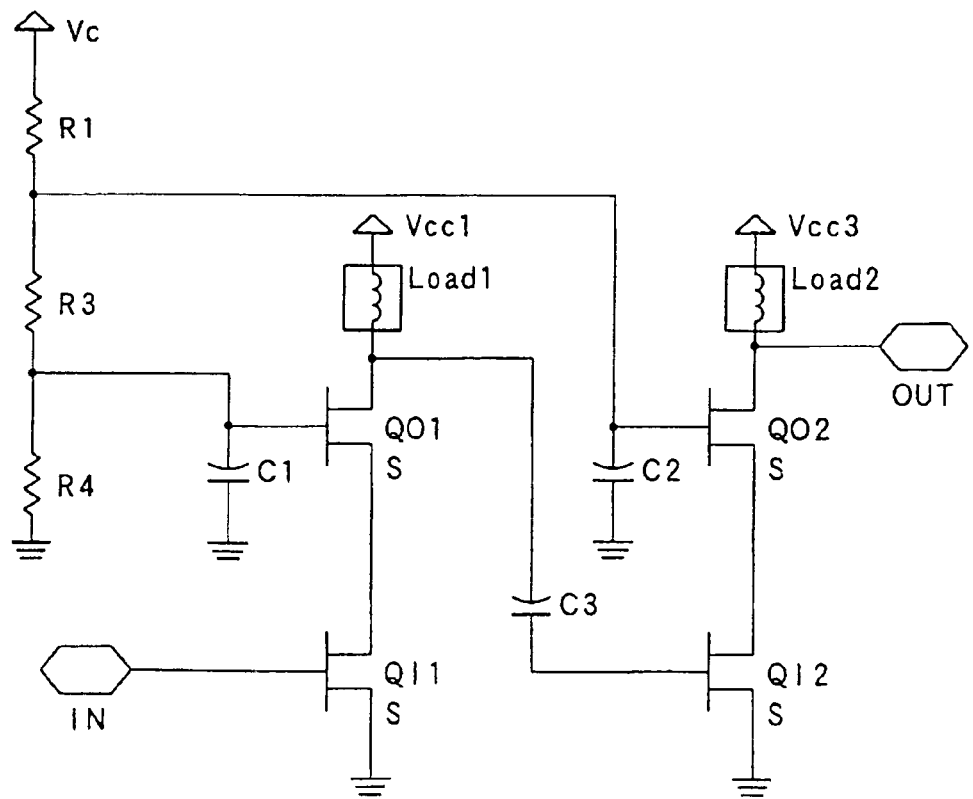
FIG. 14 is a circuit diagram of another conventional electronic circuit.

FIG. 2 shows a circuit diagram of an exemplified modification of the first embodiment, in which the control circuit 20 shown in FIG. 1 is provided with a resistor R2. In the modification, if the resistor R2 is 0 O, the voltage between the collector and emitter when the control transistor QC is turned on is VCEQC, and a voltage drop of the diode D is VD, the charging voltage VC1 of the capacitor C1 when the switch is off is VCEQC+VD. Since the charging voltage VC1 by the conventional switch shown in FIG. 12 is VCEQC, time required for the switch to be turned on from off is reduced when calculated using the expression 1 as described before. Since the value of the resistor R2 can be reduced and the time constant of the resistor R2 and capacitor C1 can be reduced, the switching time from on to off can be reduced.

Furthermore, in case VCEQC+VD=VCEQIOFF+VBEQO, since the charging voltage VC1 when the switch is off is the maximum voltage that can turn off the switch, the switching time from off to on can be reduced to the minimum. The relation of VCEQC+VD≈VCEQIOFF+VBEQO can be realized easily in an integrated circuit. The relation of VD=VBEQO can be realized by making the diode D from the pn junction having the layered structure same as the base and emitter of the output transistor QO. The relation of VCEQC=VCEQIOFF can be realized by lowering the current density when the control transistor QC is turned on to the extent at which the input transistor QI is turned off.

Figure 17:
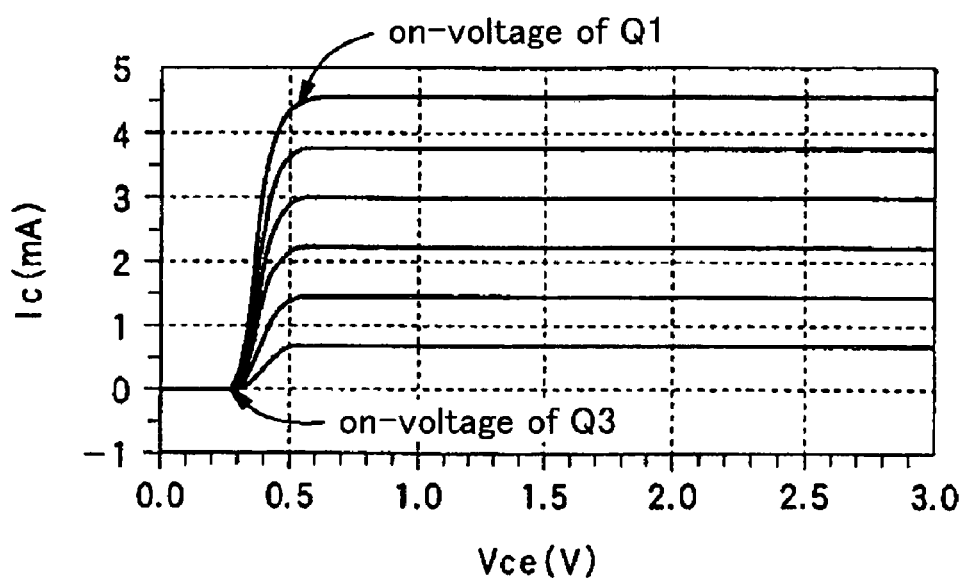
FIG. 17 is a graph exemplarily indicative of the relation between the collector current and on-voltage.

FIG. 17 shows the relation between the collector current and on-voltage. As shown in FIG. 17, when biasing the collector current of the input transistor QI with 4.5 mA, the on-voltage VCEQI assumes 0.6 V, whereas the off-voltage VCEQIOFF assumes 0.3 V. If the collector current density is lowered, the on-voltage VCEQC of the control transistor QC can be made close to VCEQIOFF. Accordingly, the relation of VCEQC=VCEQIOFF can be realized by lowering the current density when the control transistor QC is turned on to the extent at which the input transistor QI is turned off, which can be realized easily by adjusting the area ratio of the transistor.

Figure 15:
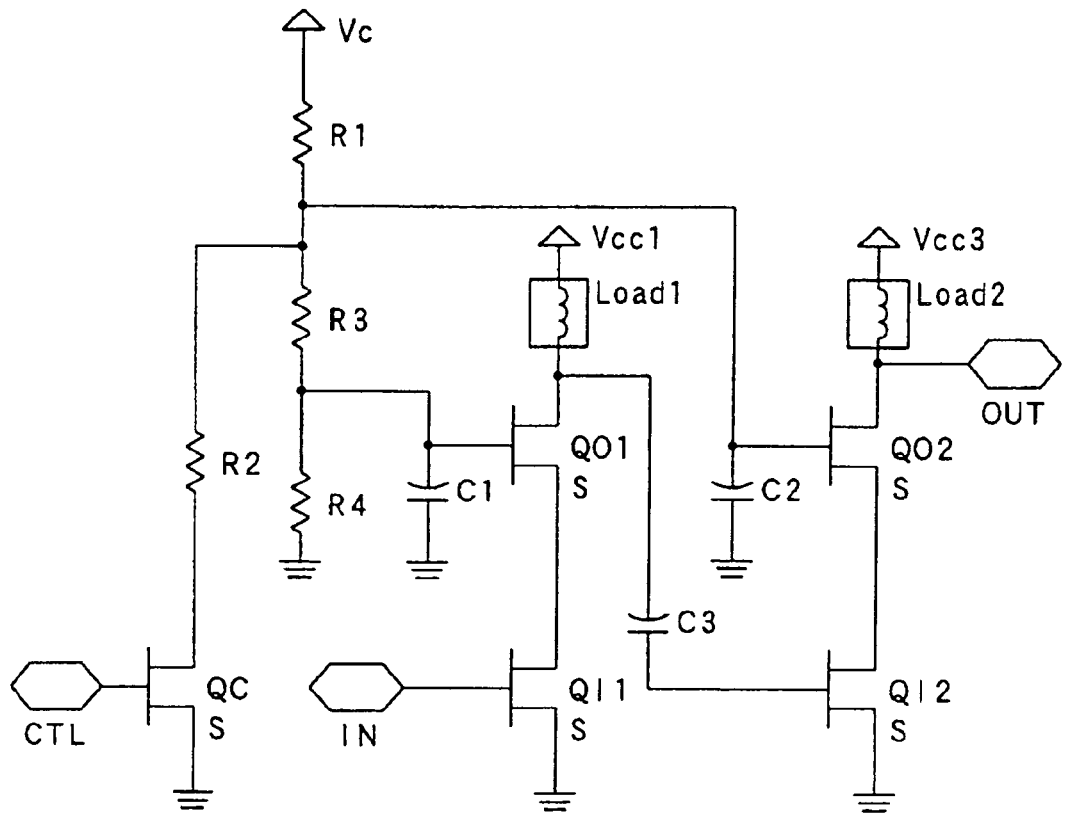
FIG. 15 is a circuit diagram of another conventional electronic circuit.
Figure 16:
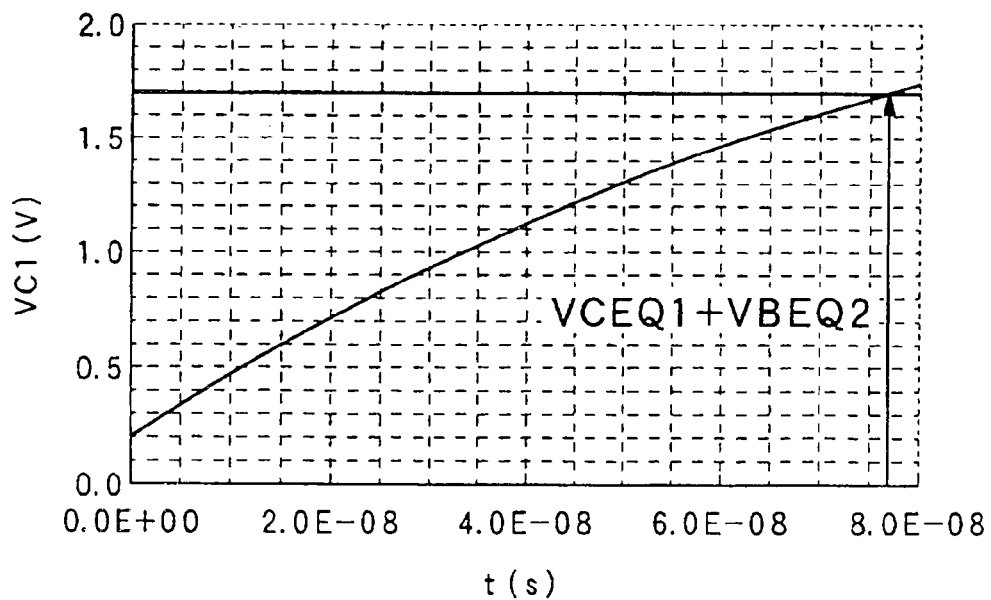
FIG. 16 is a graph exemplarily indicative of the switching time of the conventional electronic circuit.

Next, the case in which the output transistor QO is a field-effect transistor will be described with reference to the exemplified modification shown in FIG. 2. In the field-effect transistor, the voltage value to switch the status is determined by the output transistor QO alone. Therefore, as for the input transistor QI and the control transistor QC, the effect in case bipolar transistors are used is equal to the effect in case field-effect transistors are used. It is assumed herein that the minimum gate voltage value of the output transistor QO at which the output transistor QO is turned off is VGOFF, the maximum gate voltage value of the output transistor QO at which the output transistor QO is turned on is VGON. The switching time from off to on can be minimized by making the voltage drop of the control circuit 20 in the off state thereof close to VGOFF. So far, the performance is similar to the case of the conventional switch shown in FIG. 15. On the other hand, since the value of the resistor R2 can be reduced by the voltage drop of the diode D and the time constant of the resistor R2 and capacitor C1 can be reduced, the switching time from on to off can be reduced.

Figure 3:
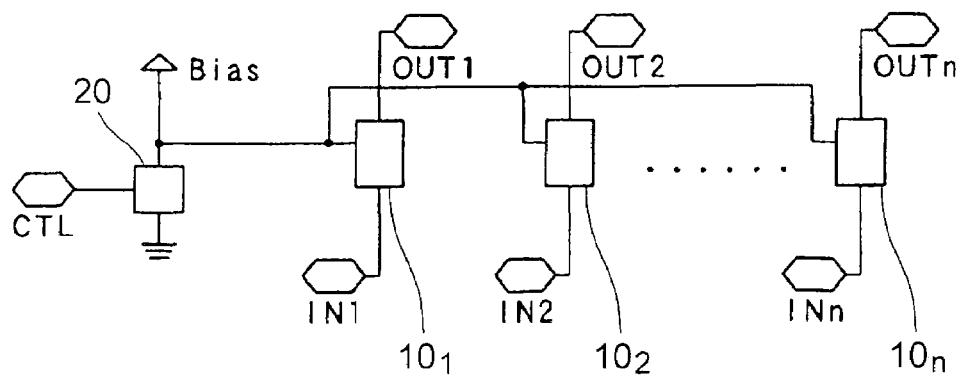
FIG. 3 is a circuit diagram of an electronic circuit according to a second embodiment of the present invention.
Figure 4:
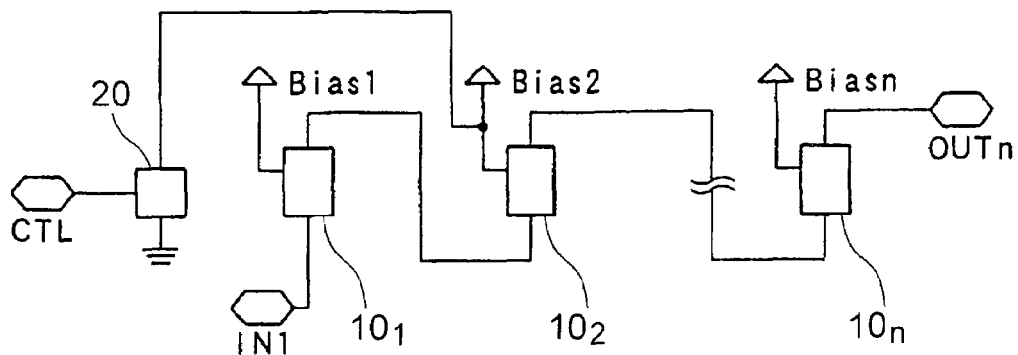
FIG. 4 is a circuit diagram of an exemplified modification of the electronic circuit shown in FIG. 3.

Referring to FIG. 3 showing a second embodiment according to the present invention, the electronic circuit includes a plurality of cascode amplifiers 10 arranged in parallel, each of which is defined in the first embodiment, and by connecting the third terminals of the output transistors QO of the plurality of cascode amplifiers 10 to the reference potential through the control circuit 20 defined in the first embodiment, the circuit properties and gains of the cascode amplifiers 10 are controlled. Since the plurality of cascode amplifiers 10 are arranged in parallel, the charging time can be reduced even though the ground capacitance is increased. In this embodiment, an electronic circuit that has two cascode amplifiers 10 arranged in parallel and has its high-frequency output terminal OUT1 connected to a high-frequency output terminal IN2 through a capacitor has a function corresponding to that of the conventional electronic circuit shown in FIG. 15. As shown in the modification in FIG. 4, at least one of the plurality of cascode amplifiers 10 arranged in parallel, each of which is defined in the first embodiment, may be controlled by the control circuit 20 defined in the first embodiment so as to switch gain of the electronic circuit.

Figure 5:
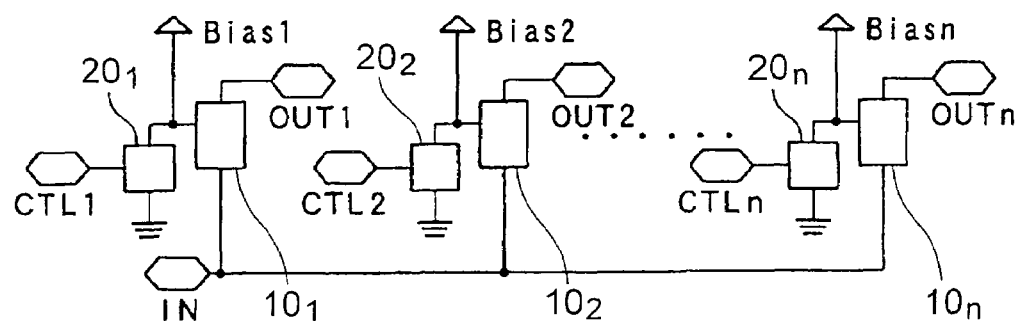
FIG. 5 is a circuit diagram of an electronic circuit according to a third embodiment of the present invention.

Referring to FIG. 5 showing an electronic circuit according to a third embodiment of the present invention, the electronic circuit includes a plurality of cascode amplifiers 10 ($10_1$, $10_2$, . . . , $10_n$) arranged in parallel, each of which is defined in the first embodiment, and the third terminals of the input transistors QI of the plurality of cascode amplifiers 10 are supplied with a common input signal. Output terminals to which the input signal is to be output are switched depending on control signals $CTL_1, CTL_2, \ldots, CTL_n$ delivered to the third terminals of the control transistors QC of the control circuits $20_1, 20_2, \ldots, 20_n$. When at least one of the control circuits $20_1, 20_2, \ldots, 20_n$ is set to be the control circuit that is defined in the first embodiment, the switching time of the path can be reduced.

Figure 6:
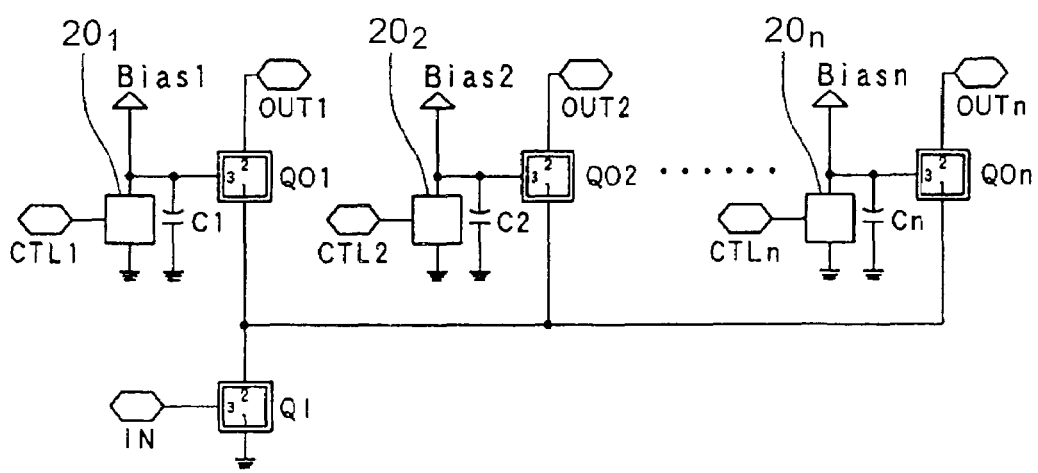
FIG. 6 is a circuit diagram of an electronic circuit according to a fourth embodiment of the present invention.

Referring to FIG. 6 showing a fourth embodiment of the present invention, the configuration of the fourth embodiment is similar to that of the third embodiment except that input transistors QI of the cascode amplifiers 10 are made common. Similar to the third embodiment, when at least one of the control circuits $20_1, 20_2, \ldots, 20_n$ is set to be the control circuit that is defined in the first embodiment, the switching time of the path can be reduced. In the fourth embodiment, the second terminals of the output transistors QO of the cascode amplifiers 10 may be connected to each other.

Since the input transistor QI is common, when one of the paths is on without fail, the input transistor QI is also on. Accordingly, the maximum voltage of the control circuit 20 m that turns off an arbitrary path "m" is VCEQI+VBEQOm, where the VCEQI is the voltage between the collector and emitter when the input transistor QI is turned on, the VBEQOm is the voltage between the base and emitter when the transistor QOm is turned on, and the transistors are bipolar transistors.

In above-described first to fourth embodiments, the first terminals of the output transistors QO of the cascode amplifiers 10 are connected to each other, and output signals from the first terminals of the output transistors QO can be varied depending on the control signals delivered to the third terminals of the control transistors QC of the control circuits 20.

Figure 7:
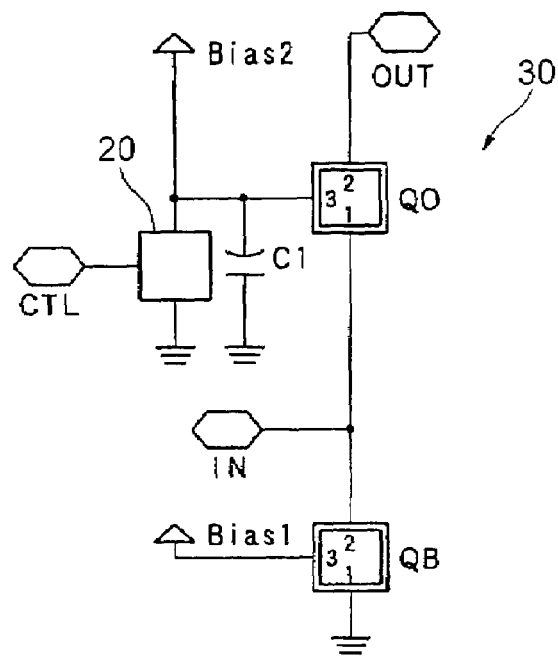
FIG. 7 is a circuit diagram of an electronic circuit according to a fifth embodiment of the present invention.

Referring to FIG. 7 showing a fifth embodiment of the present invention, the electronic circuit includes a cascode amplifier 30 that has transistors whose third terminal is used for controlling a current between the first terminal and second terminal, and a control circuit 20 that is defined in the first embodiment. The cascode amplifier 30 has an output transistor QO whose third terminal is connected to a reference potential through a capacitor, whose first terminal receives an input signal, and whose second terminal outputs an output signal, and a current source transistor QB that determines the amount of a current between the first terminal and second terminal of the output transistor QO when the output transistor QO is on, and the output transistor QO has its first terminal connected to the second terminal of the current source transistor QB. The output transistor QO has its third terminal connected to a reference potential through the control circuit 20, and controls the bias of the third terminal of the output transistor QO so as to control the output amount of the input signal to an output terminal OUT. The effect of the fifth embodiment is similar to that of the first embodiment.

Figure 8:
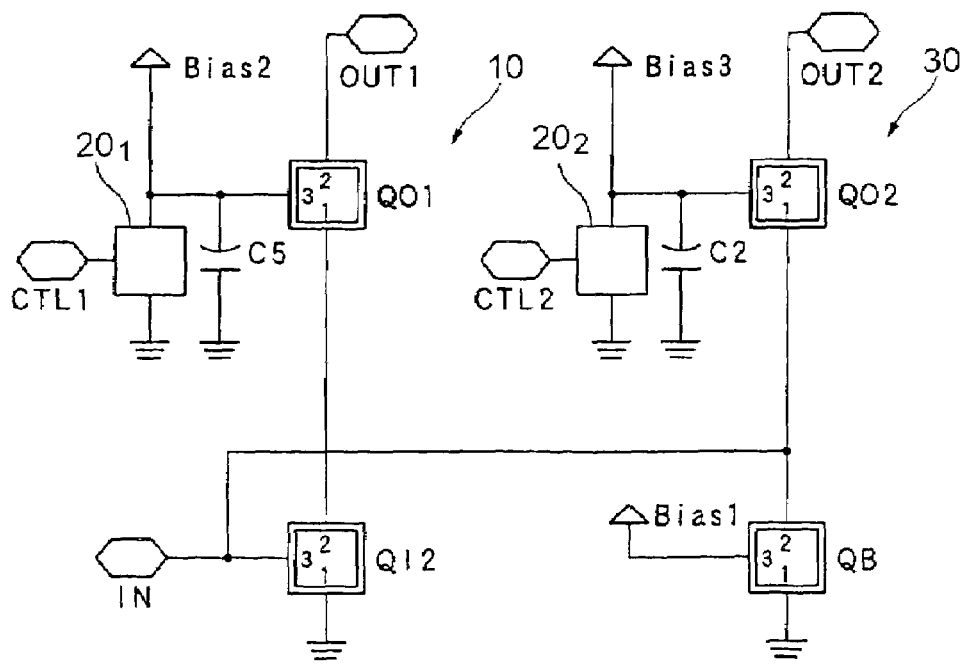
FIG. 8 is a circuit diagram of an electronic circuit according to a sixth embodiment of the present invention.

Referring to FIG. 8 showing a sixth embodiment of the present invention, the electronic circuit includes a cascode amplifier 10 that is defined in the first embodiment, and a cascode amplifier 30 that is defined in the fifth embodiment, which are arranged in parallel. The respective cascode amplifiers 10 and 30 are supplied with a common input signal, and the control circuit 20 switches the signal output terminals. When at least one of the control circuits $20_1$ and $20_2$ is controlled by the control circuit that is defined in the first embodiment, the switching time of the path can be reduced.

In the electronic circuits of the above embodiments, the transistors may be selected from the bipolar transistors or the field-effect transistors. On the other hand, the input transistor QI and the output transistor QO may be a bipolar transistor and a field-effect transistor, respectively, and vice versa. A diode D of the control circuit may be of the pn junction whose layered structure is same as that of the base and emitter of the output transistor QO, or of the pn junction formed between the base and emitter of the transistor.

In above-described embodiments, circuits or components which are not related with the effect of the present invention, such as a matching circuit, a bias circuit, and a direct current blocking capacitor is omitted, on the other hand, the third terminal of the input transistor is definitely biased.

EXAMPLE

Next, specific examples of the present invention will be described. In the following examples, all the transistors are GaAs-HBTs (hetero bipolar transistors) that are excellent in high-frequency properties, and the on-voltage between the base and emitter is set at 1.2V. On the other hand, similar effects can be obtained when using transistors of other types such as Si bipolar transistors and SiGe-HBTs. For simplicity, all the reference potentials are ground, and all the power sources Vcc1 to Vcc6 are direct current voltage sources of 3.0V. All the diodes are HBTs whose bases and collectors are connected together. The bias circuit of an emitter-grounded transistor of cascode-connected transistors and an input/output direct current blocking capacitors are omitted. It is to be noted that if the voltage of the reference potentials and power sources are different, and diodes of other types such as those of base-emitter junction, Schottky junction, etc. are used, similar effects can be obtained.

First Example

Figure 9:
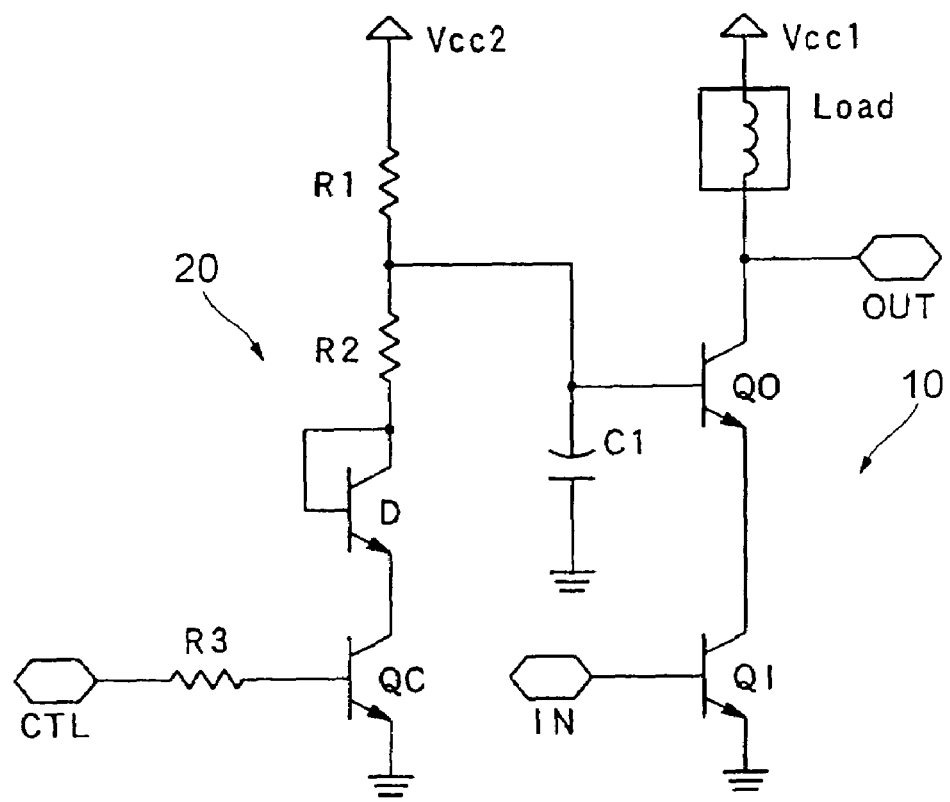
FIG. 9 is a circuit diagram of an electronic circuit according to a first example according to the present invention.
Figure 10:
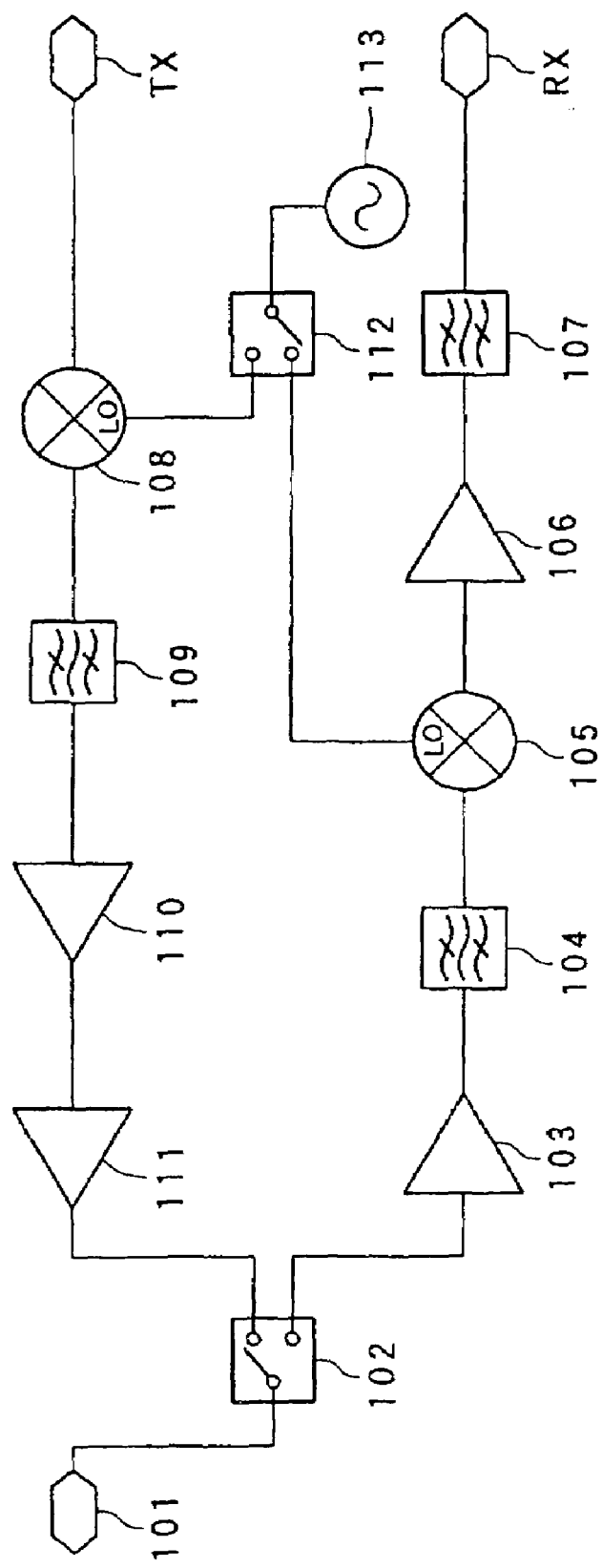
FIG. 10 is a block diagram of a high-frequency transmission/reception unit arranged in a general mobile wireless equipment.
Figure 11:
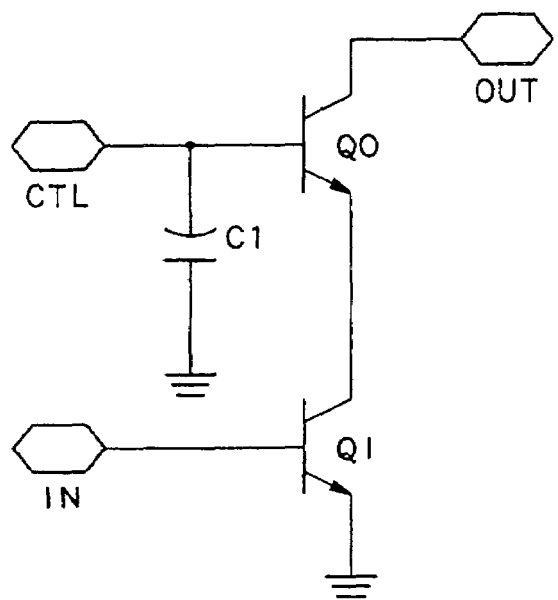
FIG. 11 is a circuit diagram of a conventional electronic circuit.

Referring to FIG. 9 showing a first example of the present invention, a base-grounded transistor QO, whose base is grounded through a capacitor C1, is cascode-connected to the collector of an emitter-grounded transistor QI whose base is connected to a high-frequency signal input terminal IN. The output transistor QO has its collector connected to a power source Vcc1 through an output terminal OUT and a load Load. The output transistor QO has its base biased by a power source Vcc2 through a resistor R1, and grounded through a resistor R2 and a control circuit 20 having arranged therein a diode D and a control transistor QC which has its base connected to a control terminal CTL through a resistor R3 and has its collector and emitter connected in series.

Figure 18:
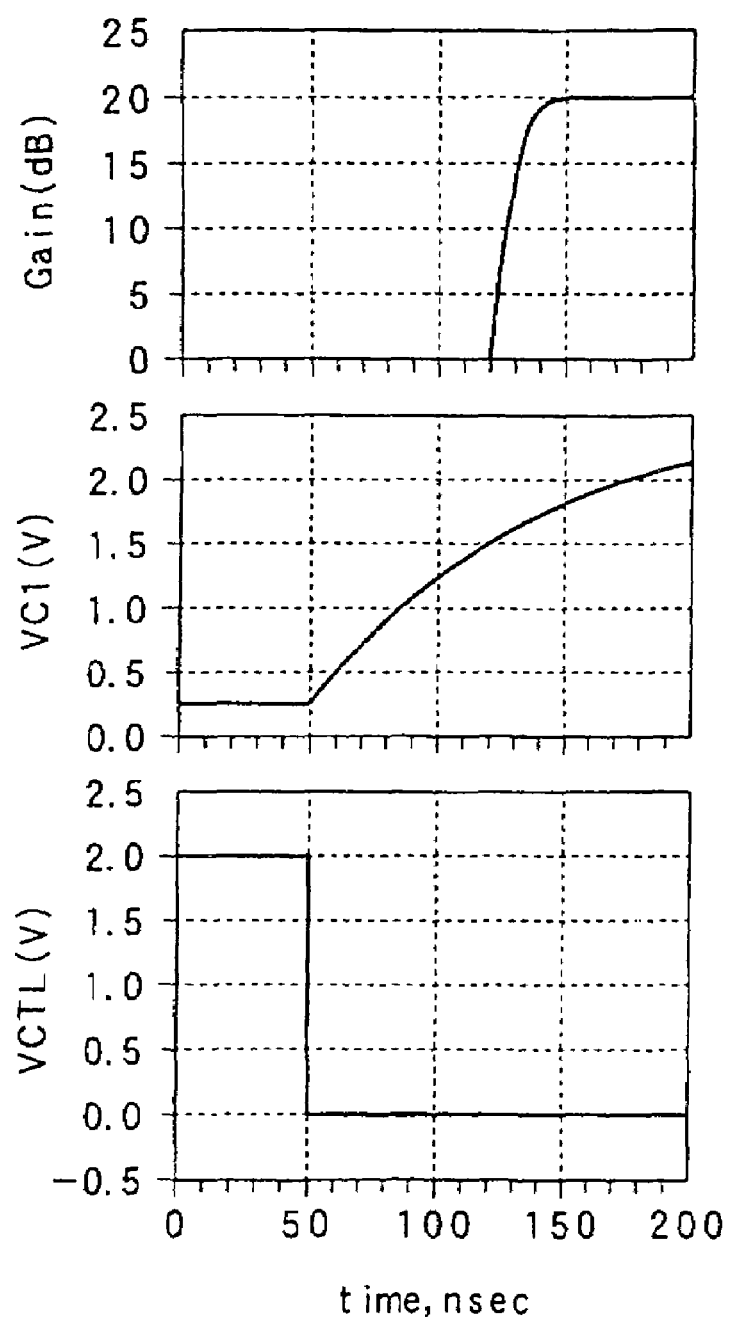
FIG. 18 is a graph exemplarily indicative of the switching time of the conventional electronic circuit.
Figure 19:
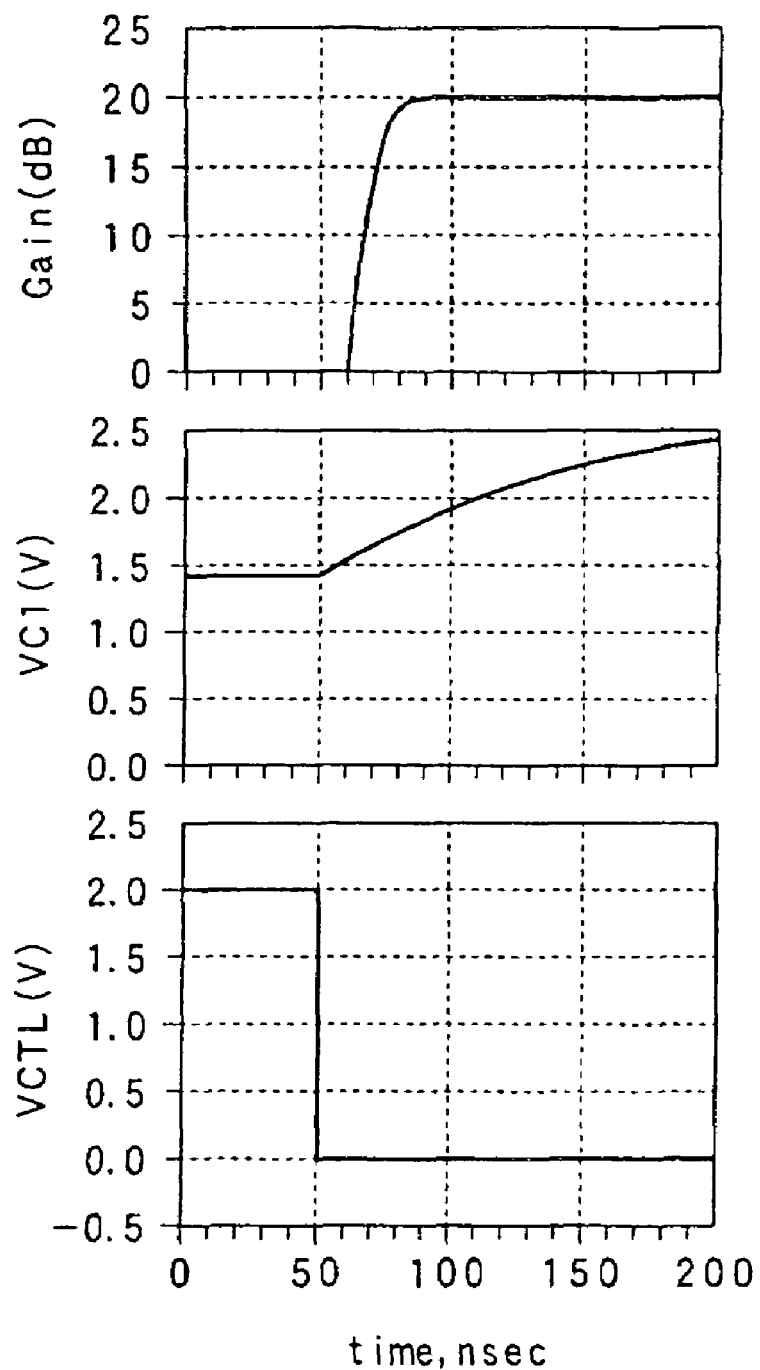
FIG. 19 is a graph exemplarily indicative of the switching time of the electronic circuit of the present invention.

FIG. 19 shows the temporal change of the decibel ratio Gain of an output signal to an input signal of 2 GHz in frequency which is calculated when the values of resistances of the resistors R1 and R3 are 10 kO, the value of resistance of the resistor R2 is 0 O, and the capacitance of the capacitor C1 is 10 pF, and a switching signal VCTL and the charging voltage VC1 of the capacitor C1. When the switching time is defined as a time period after which the gain fluctuates within ±1 dB, the switching time is about 30 ns. FIG. 18 shows the temporal change of the Gain which is calculated using the conventional electronic circuit shown in FIG. 12, and a switching signal VCTL and the charging voltage VC1 of the capacitor C1. The switching time is about 90 ns. According to the present invention, the switching time from off to on is reduced to be approximately one third.

Figure 20:
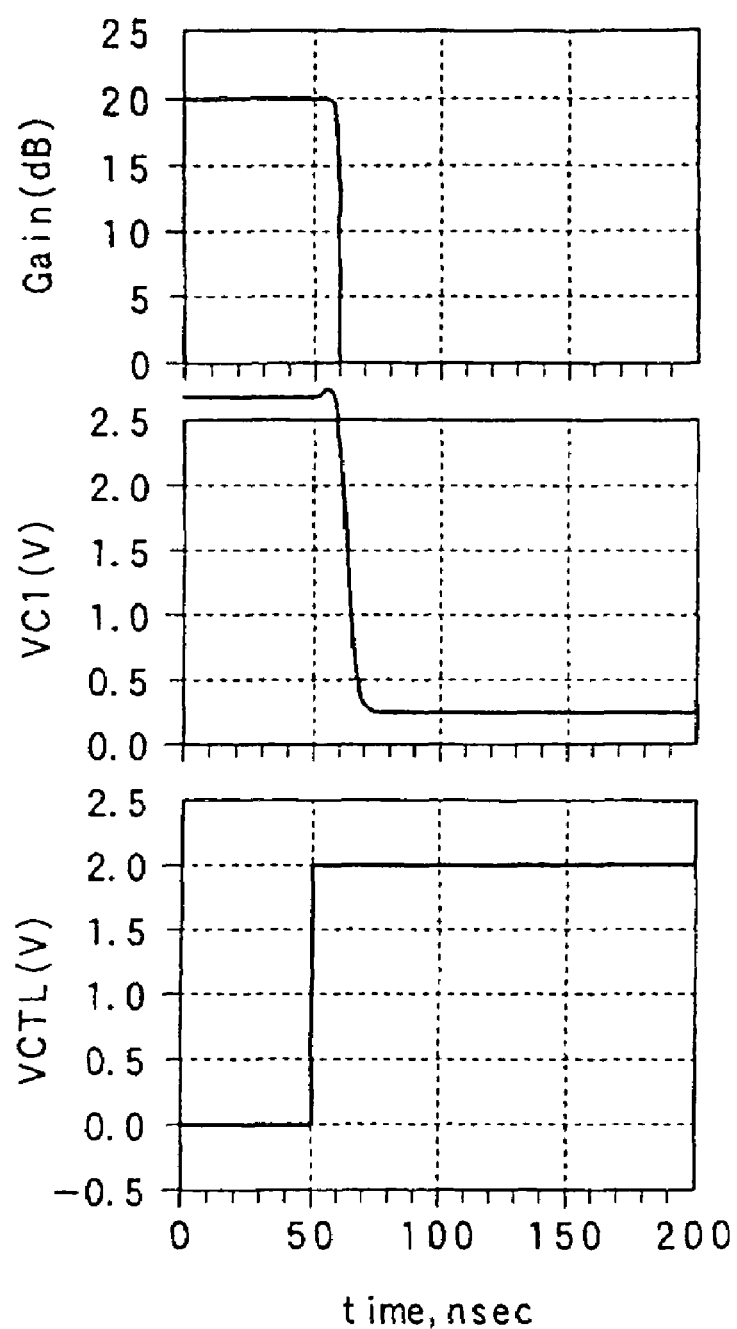
FIG. 20 is a graph exemplarily indicative of the switching time of the conventional electronic circuit.
Figure 21:
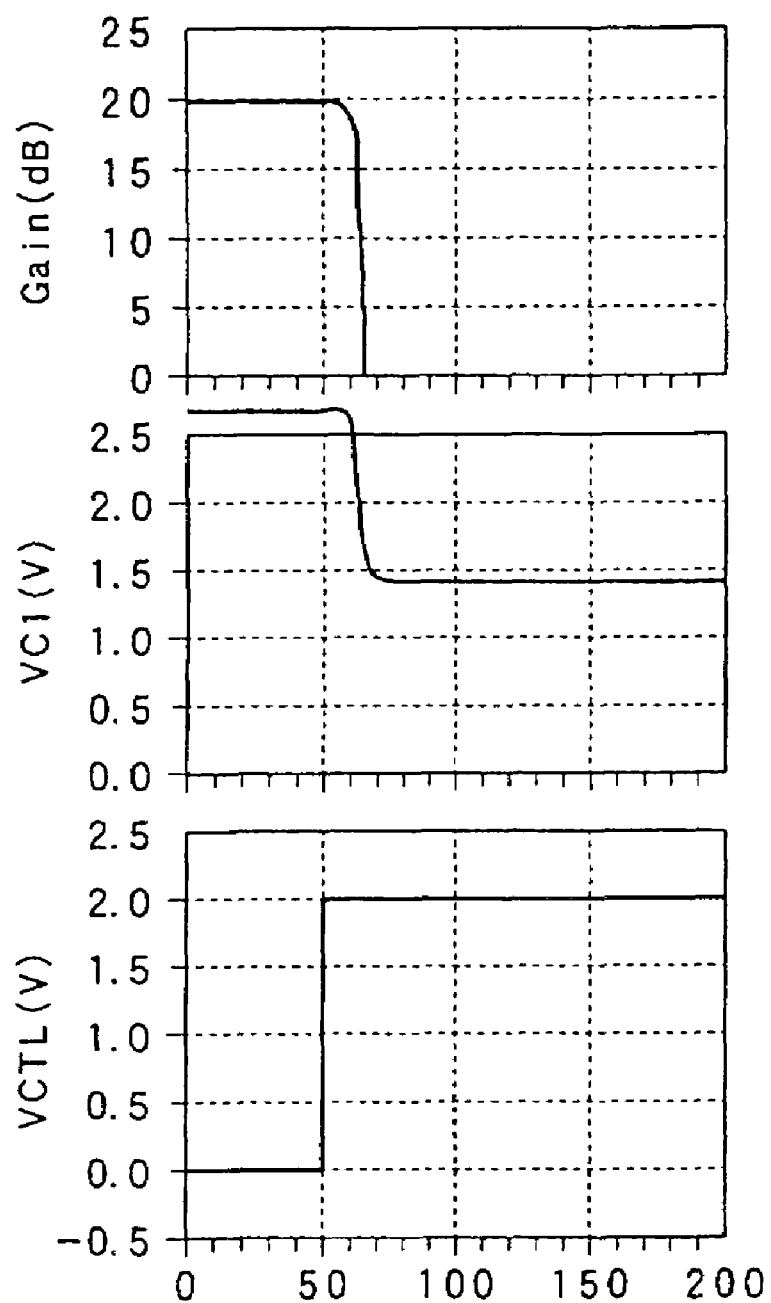
FIG. 21 is a graph exemplarily indicative of the switching time of the electronic circuit of the present invention.

FIG. 20 shows the temporal change of the Gain from on to off of the conventional electronic circuit. FIG. 21 shows graphical representations indicative of the temporal change of the gain from on to off of the electronic circuit of the present invention. When comparing these cases, since the R2 is 0 O, the conventional electronic circuit switches faster slightly, and there is substantially no difference.

The switching time from on to off is shorter than the switching time from off to on. For increasing the switching time from on to off to thereby equalize these switching times, it is sufficient to increase the resistor R2.

Second Example

Figure 22:
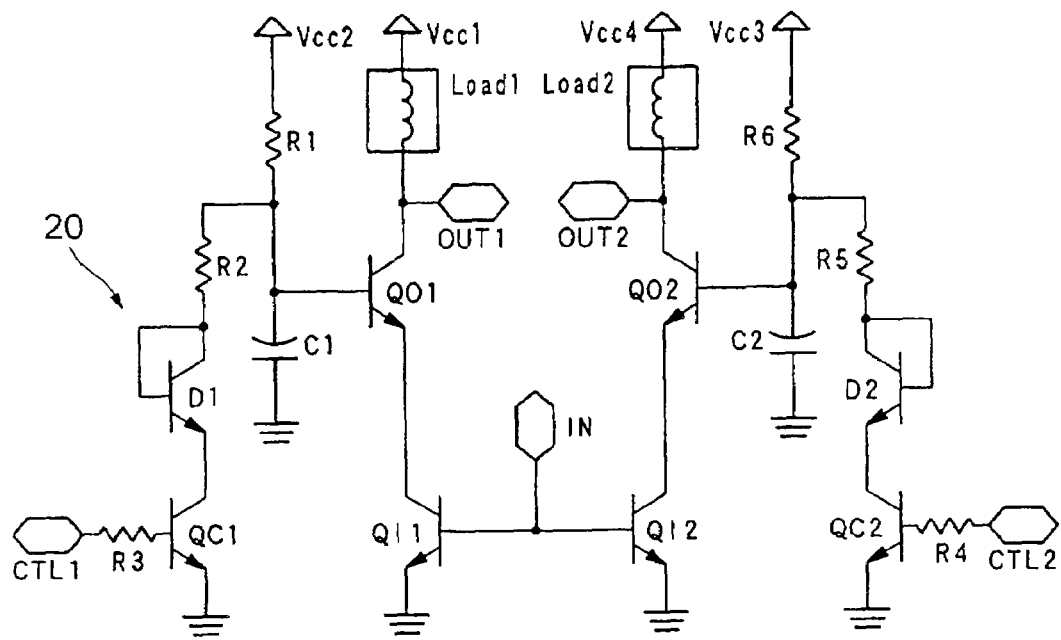
FIG. 22 is a circuit diagram of an electronic circuit according to a second example according to the present invention.

FIG. 22 shows the configuration of a second example, in which the present invention is applied to a differential amplification circuit. Base-grounded transistors QO1 and QO2, whose bases are grounded through capacitors C1 and C2, respectively, are cascode-connected to the collectors of emitter-grounded transistors QI whose bases are connected to a high-frequency signal input terminal IN. The output transistor QO1 has its collector connected to a power source Vcc1 through an output terminal OUT1 and a load Load1. The output transistor QO2 has its collector connected to a power source Vcc4 through an output terminal OUT2 and a load Load2. The output transistor QO1 has its base biased by a power source Vcc2 through a resistor R1, and grounded through a resistor R2 and a control circuit 20 having arranged therein a diode QD1 and a control transistor QC1 which has its base connected to a control terminal CTL1 through a resistor R3 and has its collector and emitter connected in series. The output transistor QO2 has its base biased by a power source Vcc3 through a resistor R2, and grounded through a resistor R5 and a control circuit 20 having arranged therein a diode QD2 and a control transistor QC2 which has its base connected to a control terminal CTL2 through a resistor R4 and has its collector and emitter connected in series.

In this example, output from the input terminal IN can be switched to the output terminals OUT1 and OUT2 by control signals from the control terminals CTL1 and CTL2.

Figure 27:
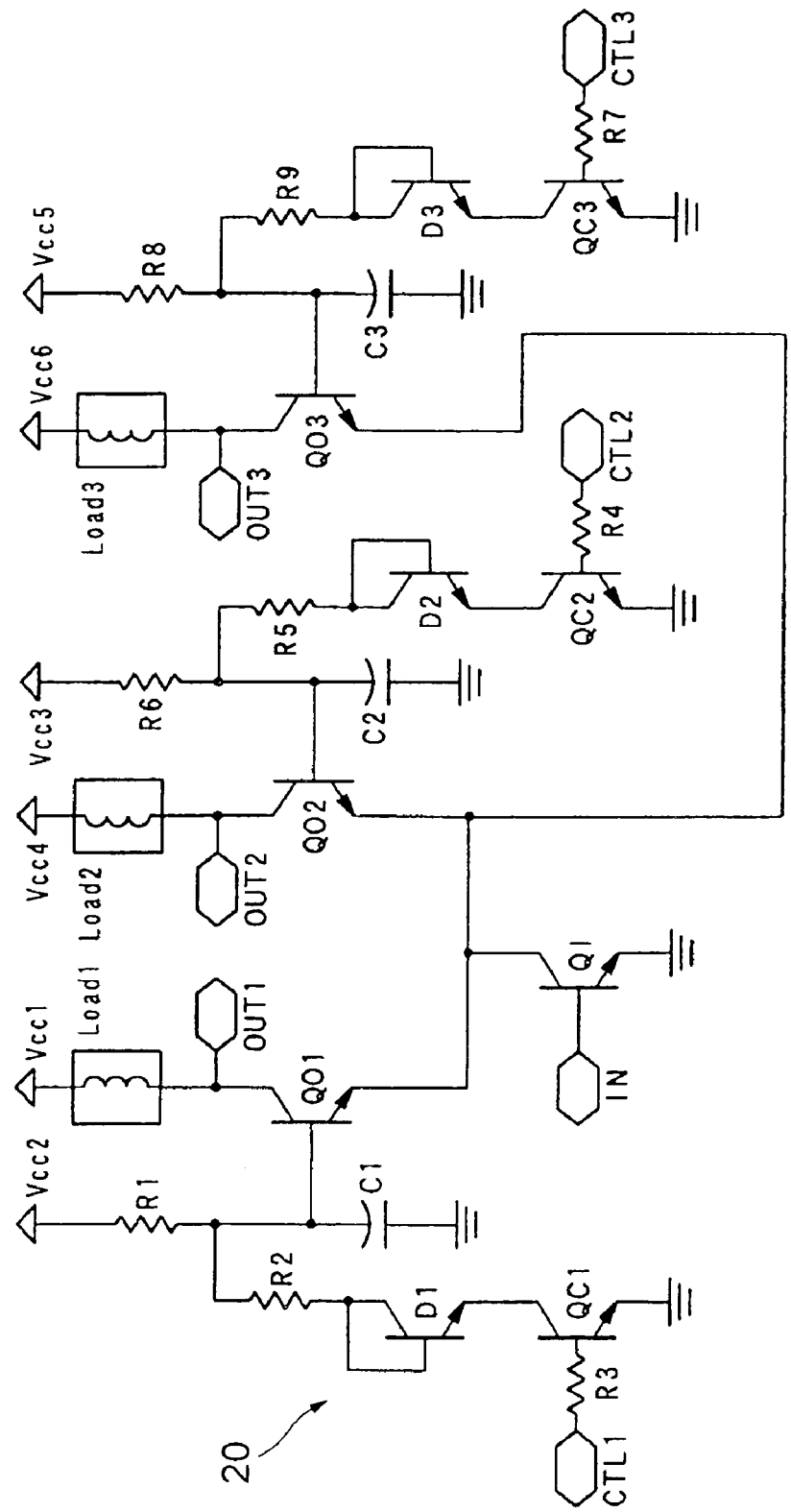
FIG. 27 is a circuit diagram of an exemplified modification of the electronic circuit shown in FIG. 22.

Similarly, the present invention can be applied to the case in which output is switched to three terminals or more, as shown in FIG. 27.

Third Example

Figure 23:
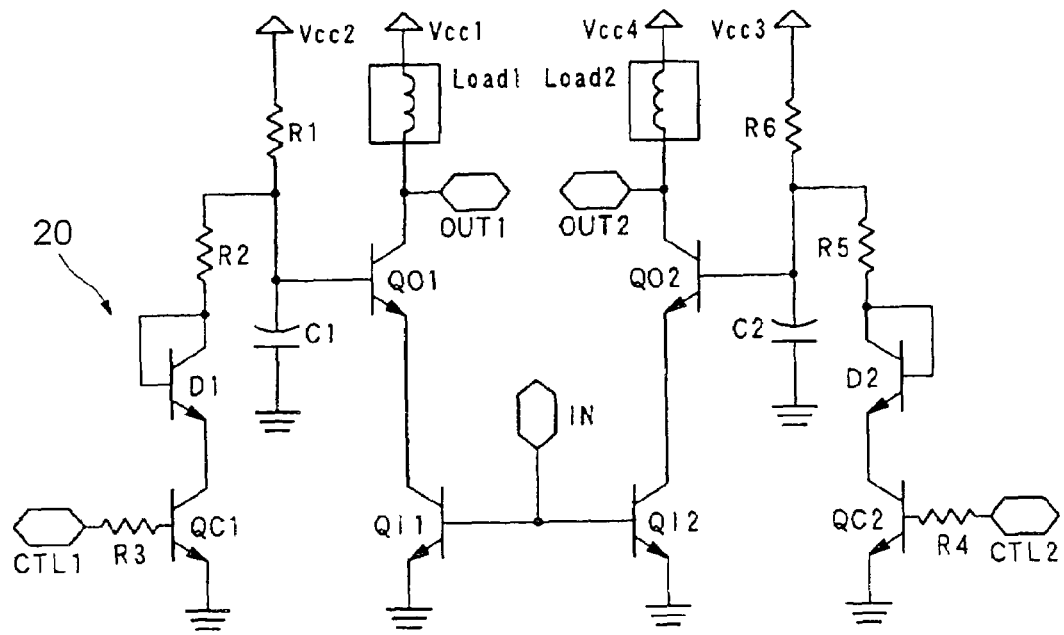
FIG. 23 is a circuit diagram of an electronic circuit according to a third example of the present invention.

Referring to FIG. 23 shows the configuration of a third example of the present invention, a base-grounded transistor QO1, whose base is grounded through a capacitor C1 is cascode-connected to the collector of an emitter-grounded transistor QI1 whose base is connected to a high-frequency signal input terminal IN. Similarly, a base-grounded transistor QO2, whose base is grounded through a capacitor C2, is cascode-connected to the collector of an emitter-grounded transistor QI2 whose base is connected to the high-frequency signal input terminal IN. The output transistor QO1 has its collector connected to a power source Vcc1 through an output terminal OUT1 and a load Load1. The output transistor QO2 has its collector connected to a power source Vcc4 through an output terminal OUT2 and a load Load2. The output transistor QO1 has its base biased by a power source Vcc2 through a resistor R1, and grounded through a resistor R2 and a control circuit 20 having arranged therein a diode D1 and a control transistor QC1 which has its base connected to a control terminal CTL1 through a resistor R3 and has its collector and emitter connected in series. The output transistor QO2 has its base biased by a power source Vcc3 through a resistor R2, and grounded through a resistor R5 and a control circuit 20 having arranged therein a diode D2 and a control transistor QC2 which has its base connected to a control terminal CTL2 through a resistor R4 and has its collector and emitter connected in series.

Figure 24:
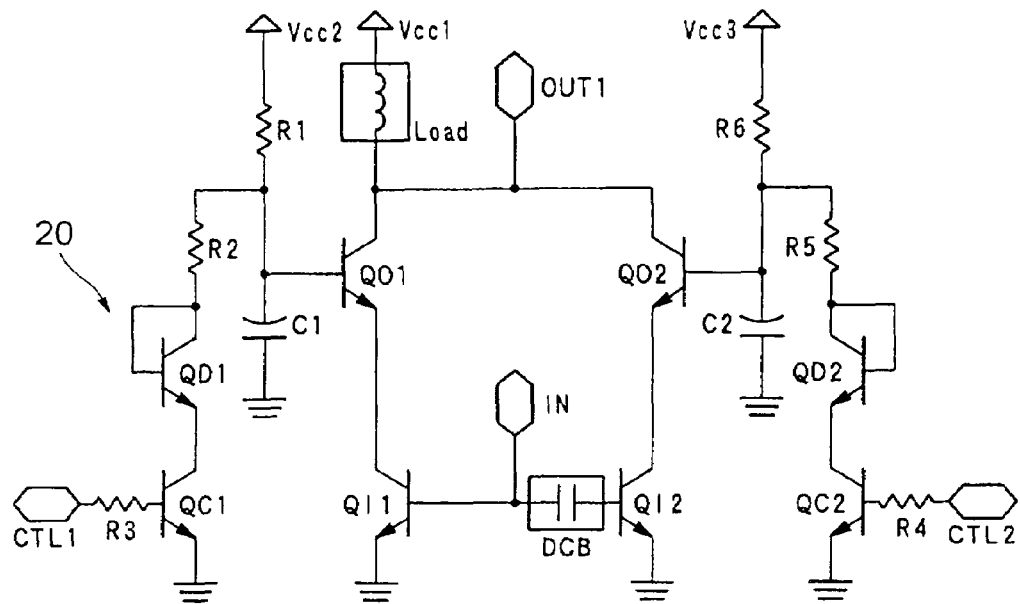
FIG. 24 is a circuit diagram of an exemplified modification of the electronic circuit of the third example.

In the circuit of this example, output from the input terminal IN can be switched to the output terminals OUT1 and OUT2 by control signals from the control terminals CTL1 and CTL2. Furthermore, it is possible to vary the current amount of the cascode amplifier of the transistors QI1 and QO1 as well as the cascode amplifier of the transistors QI2 and QO2 by connecting the bases of input transistors QI1 and QI2, which receive a high-frequency signal, through a direct current blocking capacitor etc., sharing the load Load1, and varying the bias amount of the input transistors QI1 and QI2, as shown in FIG. 24.

Fourth Example

Figure 25:
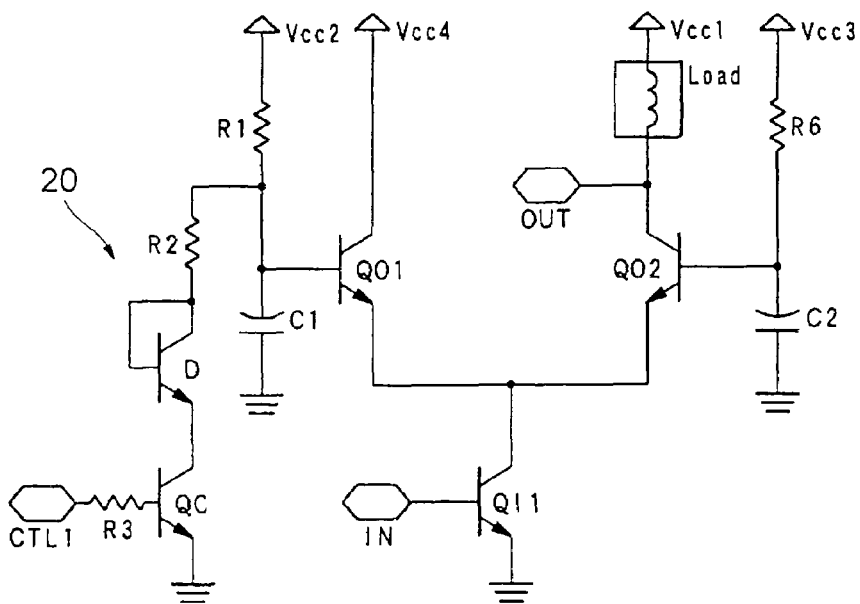
FIG. 25 is a circuit diagram of an electronic circuit according to a fourth example of the present invention.

Referring to FIG. 25 showing the configuration of a fourth example of the present invention, base-grounded transistors QO1 and QO2, whose bases are grounded through capacitors C1 and C2, respectively, are cascode-connected to the collector of an emitter-grounded transistor QI whose base is connected to a high-frequency signal input terminal IN. The output transistor QO2 has its collector connected to a power source Vcc1 through an output terminal OUT and a load Load1. The output transistor QO2 has its base biased by a power source Vcc3 through a resistor R2. The output transistor QO1 has its collector connected to a power source Vcc4. The output transistor QO1 has its base biased by a power source Vcc2 through a resistor R1, and grounded through a resistor R2 and a control circuit 20 having arranged therein a diode D and a control transistor QC which has its base connected to a control terminal CTL through a resistor R3 and has its collector and emitter connected in series.

Figure 26:
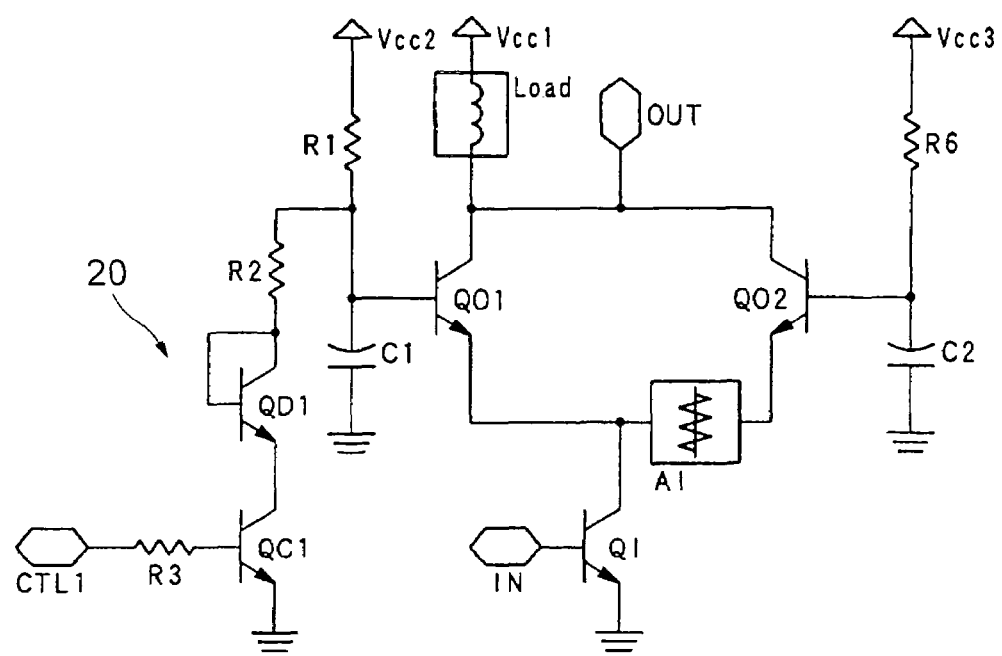
FIG. 26 is a circuit diagram of an exemplified modification of the electronic circuit shown in FIG. 25.

In this example, output to the output terminal OUT can be adjusted by a control signal from the control terminal CTL1. Output to the output terminal OUT can be adjusted by a control signal from the control terminal CTL1 similarly, when an attenuator configured by a resistor etc. is arranged on one side, as shown in FIG. 26.

Fifth Example

Figure 28:
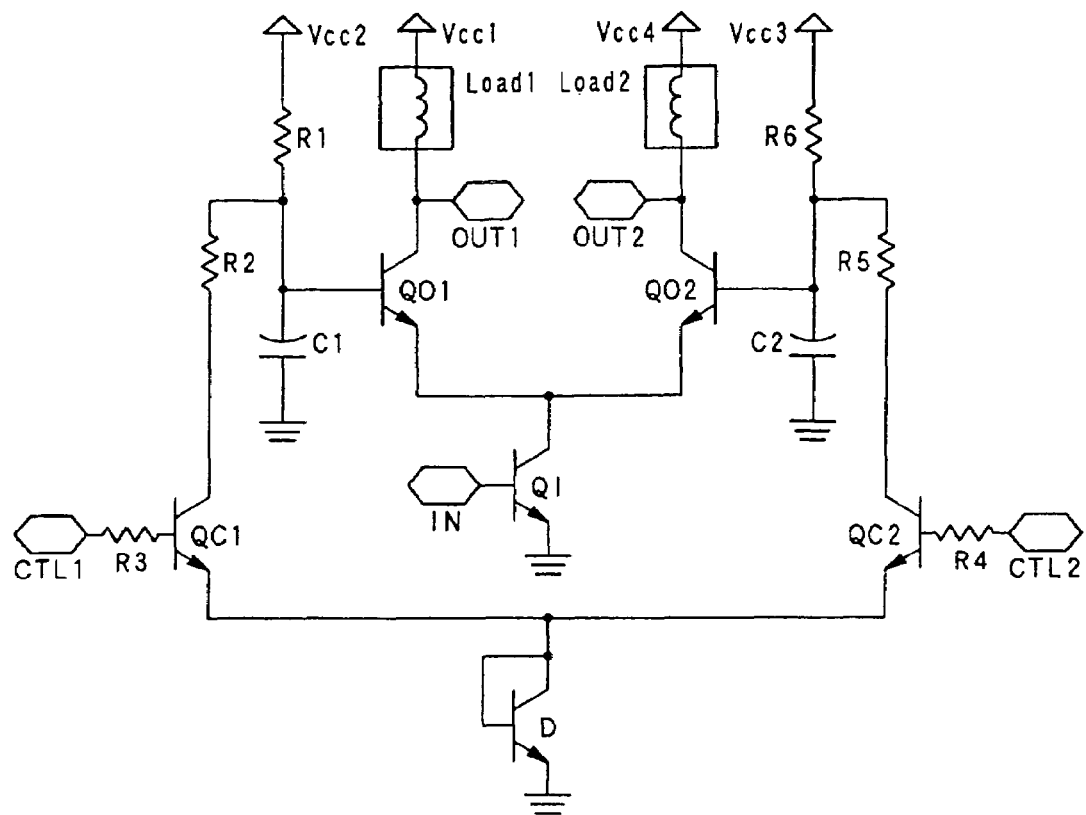
FIG. 28 is a circuit diagram of an electronic circuit according to a fifth example according to the present invention.

Referring to FIG. 28 showing the configuration of a fifth example of the present invention, the electronic circuit of the fifth example is similar to that of the second example except that the diode D is shared by the switching circuits. According to this modification, similar effects can be obtained.

The numerical values described in the above embodiments can be optimized depending on the object of the circuit and the properties of the transistors.

Although the present invention has been described in accordance with preferred embodiments thereof, it should be understood that the present invention is not limited to the embodiments, and various modifications or alterations can be implemented without departing from the scope and spirit of the present invention.

The invention claimed is:
1. An electronic circuit comprising:
  a cascode amplifier including an input transistor having first to third terminals, said third terminal of said input transistor controlling a current between said first terminal and said second terminal thereof and receiving an input signal therethrough, and an output transistor having first to third terminals, said third terminal of said output transistor controlling a current between said first terminal and said second terminal thereof, said first terminal of said output transistor being connected to said second terminal of said input transistor, said third terminal of said output transistor being connected to a reference potential through a capacitor, said second terminal of said output transistor outputting an output signal therethrough; and a control circuit including a control transistor having first to third terminals, said third terminal of said control transistor controlling a current between said first terminal and said second terminal thereof and receiving a control signal therethrough, and a diode connected in series to said second terminal of said control transistor and said reference potential, said diode having a first terminal configuring an input terminal of said control circuit and a second terminal connected to said control transistor, said first terminal of said control transistor configuring an output terminal of said control circuit, wherein:

said third terminal of said output transistor of said cascode amplifier is connected to said reference potential through said input and output terminal of said control circuit, and said control circuit controls an ON/OFF state of said output transistor.

2. The electronic circuit according to claim 1, wherein said electronic circuit comprises a plurality of said cascode amplifiers connected in parallel, and at least one of said third terminals of said output transistors of said cascode amplifiers is connected to said reference potential through said control transistor and said diode of said control circuit.

3. The electronic circuit according to claim 2, wherein said third terminals of said input transistors of said plurality of said cascode amplifiers are supplied with a common input signal, and one of terminals through which said input signal is to be delivered is selected depending on said control signal delivered to said third terminal of said control transistor of said control circuit.

4. The electronic circuit according to claim 1, wherein said cascode amplifier includes a plurality of said output transistors, and said first terminals of said plurality of said output transistors are connected together.

5. The electronic circuit according to claim 2, wherein said second terminals of said output transistors of said cascode amplifiers are connected together, and output signals from said second terminals of said output transistors are varied depending on said control signal delivered through said third terminal of said control transistor of said control circuit.

6. The electronic circuit according to claim 1, wherein said transistors are bipolar transistors.

7. The electronic circuit according to claim 1, wherein said transistors are field-effect transistors.

8. The electronic circuit according to claim 1, wherein said input transistors are bipolar transistors, and said output transistors are field-effect transistors.

9. The electronic circuit according to claim 1, wherein said input transistors are field-effect transistors, and said output transistors are bipolar transistors.

10. The electronic circuit according to claim 6, wherein said diode has a pn junction having a layered structure same as that of said base and emitter of said output transistor.

11. The electronic circuit according to claim 6, wherein said diode has a pn junction which is common to a pn junction formed between said base and emitter of one of said transistors.

12. The electronic circuit according to claim 1, wherein a voltage drop of said control circuit is equal to or less than a sum of a voltage drop between said first terminal and said second terminal of said input transistor of said cascode amplifier and a voltage drop between said first terminal and said third terminal of said output transistor of said cascode amplifier, and equal to or more than said voltage drop between said first terminal and said second terminal of said input transistor.

13. The electronic circuit according to claim 1, wherein a current density between said first terminal and second terminal of said control transistor is lower than a current density between said first terminal and second terminal of said input transistor.

14. An electronic circuit comprising:

a cascode amplifier including an output transistor having first to third terminals, said third terminal of said output transistor controlling a current between said first terminal and said second terminal and connected to a reference potential through a capacitor, said first terminal of said output transistor receiving an input signal therethrough, said second terminal of said output transistor outputting an output signal therethrough, and a current source transistor having first to third terminals, said third terminal of said current source transistor controlling a current between said first terminal and said second terminal thereof, said current source transistor determining an amount of said current between said first terminal and said second terminal of said output transistor during an on-state of said output transistor, said first terminal of said output transistor being connected to said second terminal of said current source transistor; and a control circuit including a control transistor having first to third terminals, said third terminal of said control transistor controlling a current between said first terminal and said second terminal thereof and receiving a control signal therethrough, and a diode connected in series to said second terminal of said control transistor and said reference potential, wherein:

said third terminal of said output transistor of said cascode amplifier is connected to said reference potential through said control transistor and said diode of said control circuit.

15. The electronic circuit according to claim 14, wherein said electronic circuit comprises a plurality of said cascode amplifiers connected in parallel, and at least one of said third terminals of said output transistors of said plurality of said cascode amplifiers is connected to said reference potential through said control transistor and said diode of said control circuit.

16. An electronic circuit comprising:

a first cascode amplifier including an input transistor having first to third terminals, said third terminal controlling a current between said first terminal and said second terminal and receiving a first input signal, and a first output transistor having first to third terminals, said third terminal of said first output transistor controlling a current between said first terminal and said second terminal thereof, said first terminal of said first output transistor being connected to said second terminal of said input transistor, said third terminal of said first output transistor being connected to a reference potential through a capacitor, said second terminal of said first output transistor outputting an output signal therethrough;

a second cascode amplifier including a second output transistor having first to third terminals, said third terminal of said second output transistor controlling a current between said first terminal and said second terminal thereof and connected to said reference potential through a capacitor, said first terminal of said second output transistor receiving said input signal therethrough, said second terminal of said second output transistor outputting an output signal therethrough, and a current source transistor having first to third terminals, said third terminal of said current source transistor controlling a current between said first terminal and said second terminal thereof, said current source transistor determining an amount of said current between said first terminal and said second terminal of said second output transistor during an on-state of said second output transistor, said first terminal of said second output transistor being connected to said second terminal of said current source transistor; and a control circuit including a control transistor having first to third terminals, said third terminal of said control transistor controlling a current between said first terminal and said second terminal thereof and receiving a control signal therethrough, and a diode connected in series to said second terminal of said control transistor and said reference potential, wherein:

said first cascode amplifier and said second cascode amplifier are connected in parallel, and at least one of said third terminals of said output transistors of said first and second cascode amplifiers is connected to said reference potential through said control transistor and said diode of said control circuit.

17. The electronic circuit according to claim 14, wherein said transistors are bipolar transistors.

18. The electronic circuit according to claim 16, wherein said transistors are bipolar transistors.

19. An electronic circuit comprising:

a cascode amplifier including an input transistor having first to third terminals, said third terminal of said input transistor controlling a current between said first terminal and said second terminal thereof and receiving an input signal therethrough, and an output transistor having first to third terminals, said third terminal of said output transistor controlling a current between said first terminal and said second terminal thereof, said first terminal of said output transistor being connected to said second terminal of said input transistor, said third terminal of said output transistor being connected to a reference potential through a capacitor, said second terminal of said output transistor outputting an output signal therethrough; and a control circuit including a control transistor having first to third terminals, said third terminal of said control transistor configuring a control terminal controlling a current between said first terminal and said second terminal thereof and receiving a control signal therethrough, and a diode connected in series to said second terminal of said control transistor and said reference potential, said diode having a first terminal configuring an input terminal of said control circuit and a second terminal connected to said control transistor, said first terminal of said control transistor configuring an output terminal of said control circuit, wherein said third terminal of said output transistor of said cascode amplifier is connected to said reference potential through said input and output terminal of said control circuit, and wherein said control circuit is connected to said input transistor only through said output transistor.

* * * * *

UNITED STATES PATENT AND TRADEMARK OFFICE
CERTIFICATE OF CORRECTION

| | | |
|---|---|---|
| PATENT NO. | : 7,126,427 B2 | Page 1 of 1 |
| APPLICATION NO. | : 10/512843 | |
| DATED | : October 24, 2006 | |
| INVENTOR(S) | : Yuuichi Aoki | |

It is certified that error appears in the above-identified patent and that said Letters Patent is hereby corrected as shown below:

On the Title Page:

Item [22]  PCT Filed:
Please delete: "Jun. 10, 2003", and add --October 6, 2003--

Signed and Sealed this

Thirteenth Day of February, 2007

JON W. DUDAS
*Director of the United States Patent and Trademark Office*